(12) United States Patent
Kim et al.

(10) Patent No.: US 11,528,801 B2
(45) Date of Patent: Dec. 13, 2022

(54) PRINTED CIRCUIT BOARD (71) Applicant: LG INNOTEK CO., LTD., Seoul (KR)

(72) Inventors: Yong Suk Kim, Seoul (KR); Hyun Gu Im, Seoul (KR); Byeong Kyun Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/413,427

(22) PCT Filed: Dec. 12, 2019

(86) PCT No.: PCT/KR2019/017566
§ 371 (c)(1),
(2) Date: Jun. 11, 2021

(87) PCT Pub. No.: WO2020/122626
PCT Pub. Date: Jun. 18, 2020

(65) Prior Publication Data
US 2022/0061147 A1 Feb. 24, 2022

(30) Foreign Application Priority Data
Dec. 13, 2018 (KR) .......... 10-2018-0161314

(51) Int. Cl.
*H05K 1/02* (2006.01)
(52) U.S. Cl.
CPC .......... *H05K 1/025* (2013.01); *H05K 1/0242* (2013.01); *H05K 2201/09209* (2013.01)

(58) Field of Classification Search
CPC ..... H05K 1/0284; H05K 1/025; H05K 1/0242
See application file for complete search history.

(56) References Cited

U.S. PATENT DOCUMENTS

| | | | |
|---|---|---|---|
| 7,535,095 B1 * | 5/2009 | En .......................... | H05K 3/388 257/762 |
| 8,568,856 B2 | 10/2013 | Tsuchida et al. | |
| 9,516,765 B2 | 12/2016 | Nakamura et al. | |
| 9,832,914 B2 | 11/2017 | Hyun et al. | |

(Continued)

FOREIGN PATENT DOCUMENTS

| | | |
|---|---|---|
| JP | 2001-102696 A | 4/2001 |
| JP | 2004-193168 A | 7/2004 |

(Continued)

OTHER PUBLICATIONS

Office Action dated Jun. 11, 2021 in Taiwanese Application No. 108145774.

(Continued)

*Primary Examiner* — Jeremy C Norris
(74) *Attorney, Agent, or Firm* — Saliwanchik, Lloyd & Eisenschenk (57) ABSTRACT

A printed circuit board according to an embodiment includes: an insulating layer; and a circuit pattern disposed on the insulating layer, wherein the circuit pattern includes an upper surface, a lower surface, a first side surface, and a second side surface, and surface roughness Ra of at least three surfaces of the upper surface, the lower surface, the first side surface, and the second side surface of the circuit pattern is 0.1 μm to 0.31 μm.

11 Claims, 3 Drawing Sheets

(56) References Cited

U.S. PATENT DOCUMENTS

| | | | |
|---|---|---|---|
| 10,170,405 B2 | 1/2019 | Sakai | |
| 2004/0154930 A1 | 8/2004 | Shinozaki | |
| 2004/0229024 A1 | 11/2004 | Harada et al. | |
| 2012/0152594 A1 | 6/2012 | Sheffield et al. | |
| 2014/0186651 A1 | 7/2014 | Han et al. | |
| 2015/0014027 A1* | 1/2015 | Kaneko | H05K 1/113 174/255 |
| 2017/0127519 A1* | 5/2017 | Huang | H05K 3/20 |
| 2017/0303394 A1 | 10/2017 | Nishioka et al. | |

FOREIGN PATENT DOCUMENTS

| | | |
|---|---|---|
| JP | 2014-93355 A | 5/2014 |
| JP | 2015-8260 A | 1/2015 |
| JP | 2017-191894 A | 10/2017 |
| JP | 2018-10931 A | 1/2018 |
| KR | 10-2004-0073387 A | 8/2004 |
| KR | 10-2008-0020077 A | 3/2008 |
| KR | 10-2010-0063526 A | 6/2010 |
| KR | 10-2013-0126433 A | 11/2013 |
| KR | 10-2014-0086523 A | 7/2014 |
| KR | 10-2016-0093403 A | 8/2016 |
| KR | 10-2017-0107040 A | 9/2017 |
| TW | 200715919 A | 4/2007 |

OTHER PUBLICATIONS

International Search Report dated Apr. 3, 2020 in International Application No. PCT/KR2019/017566.
Office Action dated Jul. 12, 2022 in Japanese Application No. 2021-532343.
Supplementary European Search Report dated Aug. 10, 2022 in European Application No. 19894509.9.

* cited by examiner

PRINTED CIRCUIT BOARD

CROSS-REFERENCE TO RELATED APPLICATIONS

This application is the U.S. national stage application of International Patent Application No. PCT/KR2019/017566, filed Dec. 12, 2019, which claims the benefit under 35 U.S.C. § 119 of Korean Application No. 10-2018-0161314, filed Dec. 13, 2018, the disclosures of each of which are incorporated herein by reference in their entirety.

TECHNICAL FIELD

Embodiments relate to a printed circuit board, and more particularly to a printed circuit board capable of minimizing signal loss by reducing surface roughness of a circuit pattern of the printed circuit board.

BACKGROUND

A printed circuit board (PCB) is formed by printing a circuit line pattern at an electrical insulating substrate with a conductive material such as copper, and thus the PCB refers to a board just before electronic components are mounted thereon. That is, in order to densely mount various types of electronic elements on a planar surface, the PCB refers to a circuit board having a planar surface on which a mounting position of each component is fixed and a circuit pattern connecting the components is fixedly printed.

In general, a surface processing method for a circuit pattern included in the above-described PCB uses an organic solderability preservative (OSP) method, an electrolytic nickel/gold method, an electrolytic nickel/gold-cobalt alloy method, an electroless nickel/palladium/gold method, etc.

Here, the above-described surface processing methods vary depending on a use thereof, and the use includes, for example, soldering, wire bonding, and a connector.

The components mounted on the printed circuit board can transmit signals generated from the components by circuit patterns connected to the components.

Meanwhile, with the recent increase in functionality of portable electronic devices and the like, in order to perform high-speed processing of a large amount of information, the frequency of signals is increasing, and a circuit pattern of a printed circuit board suitable for high-frequency applications is required.

The circuit pattern of such a printed circuit board is desired to reduce transmission loss so that a high frequency signal may be transmitted without degrading the quality thereof.

Transmission loss of printed circuit board circuit patterns is mainly made up of conductor loss due to a copper foil and dielectric loss due to an insulating resin substrate.

The conductor loss can be further increased by the skin effect of the copper foil that appears more prominently at higher frequencies.

Therefore, a printed circuit board having a new structure that can reduce the conductor loss due to the skin effect is required.

DISCLOSURE

Technical Problem

An embodiment is directed to providing a printed circuit board capable of minimizing signal loss.

Technical Solution

A printed circuit board according to an embodiment includes: an insulating layer; and a circuit pattern disposed on the insulating layer, wherein the circuit pattern includes an upper surface, a lower surface, a first side surface, and a second side surface, and surface roughness Ra of at least three surfaces of the upper surface, the lower surface, the first side surface, and the second side surface of the circuit pattern is 0.1 μm to 0.31 μm.

In addition, the surface roughness Ra of the upper surface, the first side surface, and the second side surface of the circuit pattern is 0.1 μm to 0.13 μm.

Further, the surface roughness Ra of the upper surface, the lower surface, the first side surface, and the second side surface of the circuit pattern is 0.1 μm to 0.17 μm.

In addition, the surface roughness Ra of the upper surface, the first side surface, and the second side surface of the circuit pattern varies depending on lengths of the upper surface, the first side surface, and the second side surface in a cross section in a width direction of the circuit pattern.

Further, the length of the upper surface of the circuit pattern is greater than those of the first side surface and the second side surface, and the surface roughness of the upper surface of the circuit pattern is smaller than that of the first side surface and the second side surface.

In addition, the surface roughness of the upper surface, the lower surface, the first side surface, and the second side surface of the circuit pattern varies depending on lengths of the upper surface, the lower surface, the first side surface, and the second side surface in a cross section in a width direction of the circuit pattern.

Further, the lengths of the upper surface and the lower surface of the circuit pattern are larger than the lengths of the first side surface and the second side surface, and the surface roughness of the upper surface and the lower surface of the circuit pattern is smaller than the surface roughness of the first side surface and the second side surface.

In addition, surface roughness Rq of the upper surface, the lower surface, the first side surface, and the second side surface of the circuit pattern is 0.42 μm or less.

Further, the impedance of the circuit pattern is 35.3Ω or less.

Meanwhile, a printed circuit board according to an embodiment includes: an insulating layer; and a circuit pattern disposed on the insulating layer, wherein the circuit pattern includes an upper surface, a lower surface, a first side surface, and a second side surface, surface roughness of the upper surface, the lower surface, the first side surface, and the second side surface of the circuit pattern varies depending on lengths of the upper surface, the lower surface, the first side surface, and the second side surface in a cross section in a width direction of the circuit pattern, the lengths of the upper and lower surfaces of the circuit pattern are greater than those of the first side surface and the second side surface, the surface roughness of the upper and lower surfaces of the circuit pattern is smaller than that of the first and second side surfaces, and surface roughness Ra of the upper surface, the lower surface, the first side surface, and the second side surface of the circuit pattern is 0.1 μm to 0.17 μm.

Effects of the Invention

A printed circuit board according to an embodiment may transmit a high frequency signal via a circuit pattern while minimizing signal loss.

The high frequency signal due to the skin effect may be affected by surface roughness of the circuit pattern. That is, in high frequency signals transmitted along a skin, the surface roughness acts as a resistance as surface roughness increases, and thus loss of the high frequency signal may be caused.

Accordingly, the printed circuit board according to the embodiment controls the surface roughness of at least three or more surfaces of the circuit pattern, and thus signal loss due to the skin effect during transmission of the high frequency signal may be minimized.

In addition, in the circuit pattern of the printed circuit board according to the embodiment, a magnitude of signal movement, that is, the surface roughness in a portion having a large length among surfaces of the circuit pattern is made smaller than that of a portion having a small length, and thus characteristics of the signal transmission may be maximized.

DETAILED DESCRIPTION OF THE EMBODIMENTS

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (A, and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a display substrate according to an embodiment will be described with reference to drawings.

Figure 1:
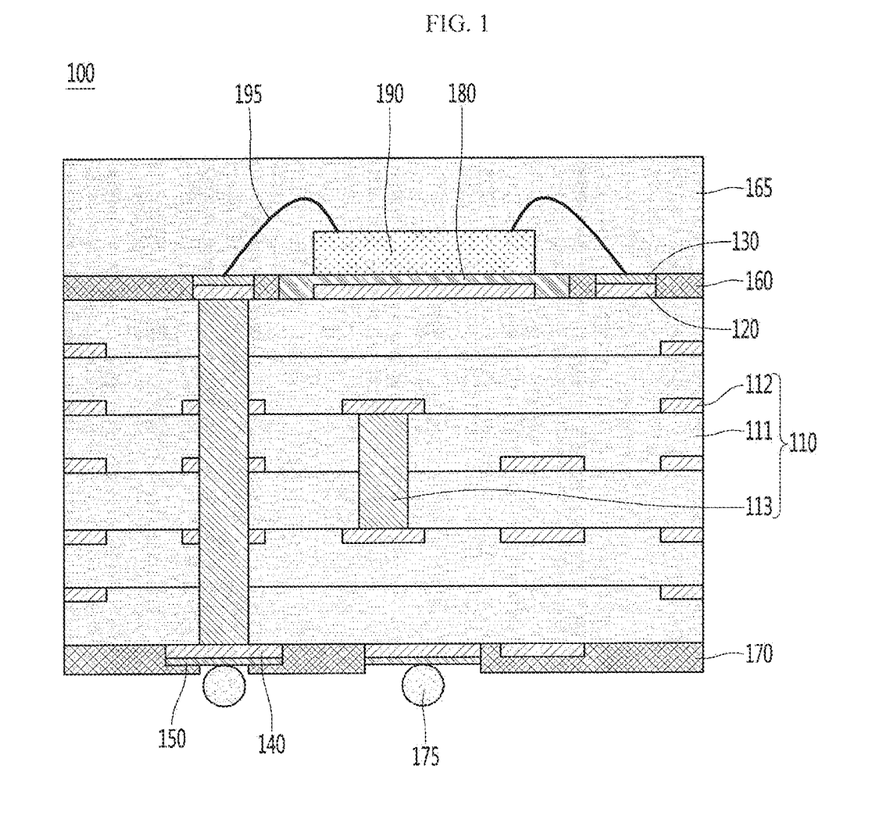
FIG. 1 is a cross-sectional view of a printed circuit board according to an embodiment.

Referring to FIG. 1, a printed circuit board according to an embodiment includes an insulating substrate 110, a first pad 120, a first upper metal layer 130, a second pad 140, a second upper metal layer 150, a first passivation layer 160, a second passivation layer 170, an adhesive member 175, a solder paste 180, an electronic component 190, and a wire 195.

Referring to FIG. 1, the insulating substrate 110 may have a flat plate structure. The insulating substrate 110 may be a printed circuit board (PCB). Here, the insulating substrate 110 may be implemented as a single substrate, and alternatively, may be implemented as a multilayer substrate in which a plurality of insulating layers are sequentially stacked.

Figure 2:
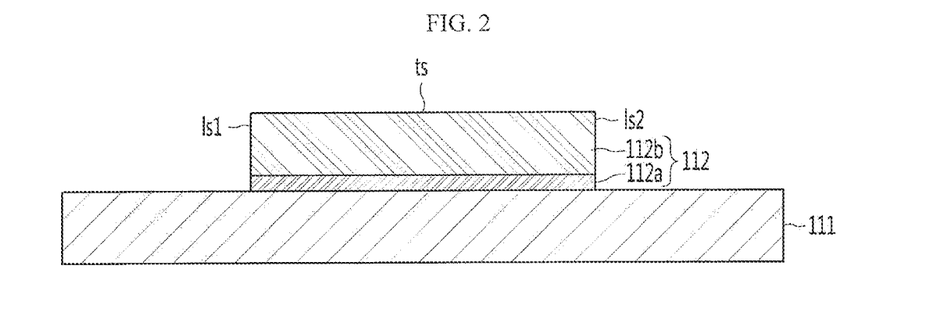
FIGS. 2 and 3 are views illustrating a circuit pattern of FIG. 1 in detail.

Accordingly, the insulating substrate 110 includes a plurality of insulating layers 111. As shown in FIG. 2, the plurality of insulating layers 111 may include a first insulating layer, a second insulating layer, a third insulating layer, a fourth insulating layer, a fifth insulating layer, and a sixth insulating layer from an uppermost portion. In addition, a circuit pattern 112 may be disposed at each of surfaces of the first to sixth insulating layers.

The plurality of insulating layers 111 is a substrate on which an electric circuit capable of changing wiring is disposed and may include all of printing, a wiring plate, and an insulating substrate which are made of an insulating material capable of forming a circuit pattern 112 on a surface of the insulating layer.

The plurality of insulating layers 111 may be rigid or flexible. For example, the insulating layer 111 may include glass or plastic. Specifically, the insulating layer 111 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

Further, the insulating layer 111 may include an optically isotropic film. For example, the insulating layer 111 may include cyclic olefin copolymer (COC), cyclic olefin polymer (COP), optically isotropic PC, optically isotropic polymethylmethacryate (PMMA), etc.

Furthermore, the insulating layer 111 may be partially bent while having a curved surface. That is, the insulating layer 111 may partially have a plane and may partially be bent while having a curved surface. Specifically, an end portion of the insulating layer 111 may be bent while having a curved surface, or bent or crooked while having a surface with a random curvature.

In addition, the insulating layer 111 may be a flexible substrate having flexibility. Further, the insulating layer 111 may be a curved or bent substrate. At this point, the insulating layer 111 may form a wiring layout for electrical wirings which connect circuit components based on a circuit design, and electrical conductors may be disposed on an insulating material. Further, electronic components may be mounted on the insulating layer 111, and the insulating layer 111 may form wirings configured to connect the electronic components to make a circuit, and may mechanically fix the components besides functioning to electrically connect the components.

Each of the circuit patterns 112 is disposed at the surface of the insulating layer 111. The circuit pattern 112 may be a wiring for transmitting an electrical signal, and may be formed of a metal material having high electrical conductivity. For this, the circuit pattern 112 may be formed of at least one metal material selected from among gold (Au), silver (Ag), platinum (Pt), titanium (Ti), tin (Sn), copper (Cu) and zinc (Zn).

In addition, the circuit pattern 112 may be formed of paste or solder paste including at least one metal material selected from among gold (Au), silver (Ag), platinum (Pt), titanium (Ti), tin (Sn), copper (Cu) and zinc (Zn), which are excellent in bonding strength. Preferably, the circuit pattern 112 may be formed of copper (Cu) having high electrical conductivity and relatively low cost.

The circuit pattern 112 may be formed by a general process of manufacturing a PCB, such as an additive process, a subtractive process, a modified semi additive process (MSAP), a semi additive process (SAP), etc., and detailed descriptions thereof will be omitted herein.

In addition, surface roughness of the circuit pattern 112, that is, roughness of the circuit pattern 112 may have a predetermined value. The roughness of the circuit pattern 112 will be described in detail below.

At least one via 113 is formed in the insulating layer 111. The via 113 is disposed to be passing through at least one of the plurality of insulating layers 111. The via 113 may pass through only one of the plurality of insulating layers 111, and alternatively, may be formed to commonly pass through at least two insulating layers of the plurality of insulating layers 111. Accordingly, the via 113 electrically connects circuit patterns disposed at surfaces of different insulating layers.

The via 113 may be formed by filling, with a conductive material, the inside of a through hole (not shown) passing through at least one of the plurality of insulating layers 111.

The through hole may be formed by any one of mechanical, laser, and chemical processing. When the through hole is formed by mechanical processing, a method such as milling, drilling and routing may be used. When the through hole is formed by laser processing, a method of UV or $CO_2$ laser may be used. And when the through hole is formed by chemical processing, the insulating layer 111 may be opened by using a chemical including aminosilane, ketones, or the like.

Meanwhile, the laser processing is a cutting method in which a part of a material is melted and evaporated by concentrating optical energy at a surface to take a desired shape. Complex formation by a computer program may be easily processed, and composite materials which are difficult to cut by other methods can be processed.

In addition, the processing by the laser may have a cutting diameter of at least 0.005 mm, and has a wide range of thickness that may be processed.

It is preferable to use an yttrium aluminum garnet (YAG) laser or $CO_2$ laser or ultraviolet (UV) laser as the laser processing drill. The YAG laser is a laser capable of processing both a copper foil layer and an insulating layer, and the $CO_2$ laser is a laser capable of processing only an insulating layer.

When the through hole is formed, the via 113 is formed by filling the inside of the through hole with a conductive material. The metal material forming the via 113 may be anyone selected from among copper (Cu), silver (Ag), tin (Sn), gold (Au), nickel (Ni), and palladium (Pd). The conductive material may be filled by any one of electroless plating, electrolytic plating, screen printing, sputtering, evaporation, ink jetting, and dispensing, or a combination thereof.

The first pad 120 is disposed on the insulating layer disposed at the uppermost portion of the plurality of insulating layers 111 and the second pad 140 is disposed under the insulating layer disposed at the lowermost portion of the plurality of insulating layers 111.

In other words, the first pad 120 is disposed on the uppermost insulating layer 111 in which the electronic component 190 111 is to be formed, among the plurality of insulating layers 111. The first pads 120 may be formed in plural on the uppermost insulating layer. In addition, a part of the first pad 120 may serve as a pattern for signal transmission and the other part thereof may serve as an inner lead electrically connected to the electronic component 190 through the wire 195. In other words, the first pad 120 includes a wire-bonding pad for wire bonding.

In addition, a second pad 140 is disposed under the lowermost insulating layer to which an external substrate (not shown) is attached, among the plurality of insulating layers 111. Like the first pad 120, a part of the second pad 140 also may serve as a pattern for signal transmission, and the other part thereof may serve as an outer lead in which the adhesive member 175 is disposed for attachment of the external substrate. In other words, the second pad 140 includes a soldering pad for soldering.

In addition, the first upper metal layer 130 is disposed on the first pad 120, and the second upper metal layer 150 is disposed under the second pad 140. The first upper metal layer 130 and the second upper metal layer 150 are formed of the same material and increases characteristics of the wire bonding or soldering while protecting the first pad 120 and the second pad 140, respectively.

For this, the first upper metal layer 130 and the second upper metal layer 150 are formed of a metal including gold (Au). Preferably, the first upper metal layer 130 and the second upper metal layer 150 may include pure gold (purity of 99% or more) only, or alternately, may be formed of an alloy including gold (Au). When the first upper metal layer 130 and the second upper metal layer 150 are formed of an alloy including gold, the alloy may be formed of a gold alloy including cobalt.

The solder paste 180 is disposed at the uppermost insulating layer among the plurality of insulating layers. The solder paste is an adhesive for fixing the electronic component 190 attached to the insulating substrate 110.

Accordingly, the solder paste 180 may be referred to as an adhesive. The adhesive may be a conductive adhesive, or alternatively, may be a non-conductive adhesive.

That is, the printed circuit board 100 may be a substrate to which the electronic component 190 is attached in a wire-bonding manner, and accordingly, a terminal (not shown) of the electronic component 190 is not disposed on the adhesive.

In addition, the adhesive is not electrically connected to the electronic component 190. Therefore, a non-conductive adhesive may be used as the adhesive, or alternatively, a conductive adhesive may be used as the adhesive.

The conductive adhesive is largely classified into an anisotropic conductive adhesive and an isotropic conductive adhesive, and is basically composed of conductive particles such as Ni, Au/polymer, Ag, or the like, and thermosetting and thermoplastic resins, or a blend type insulating resin mixing characteristics of the two resins.

In addition, the non-conductive adhesive may also be a polymeric adhesive and preferably may be a non-conductive polymer adhesive including a thermosetting resin, a thermoplastic resin, a filler, a curing agent, and a curing accelerator.

Further, the first passivation layer 160, through which at least a part of a surface of the first upper metal layer 130 is exposed, is disposed on the uppermost insulating layer. The first passivation layer 160 is disposed to protect the surface of the uppermost insulating layer, and, for example, may be a solder resist.

In addition, the wire 195 is bonded to the first upper metal layer 130, and accordingly, the first pad 120 and the electronic component 190 may be electrically connected to each other.

Here, the electronic component 190 may include both a device and a chip. The device may be classified into an active device and a passive device. The active device refers to a device that positively uses non-linear characteristics. The passive device refers to a device that does not use non-linear characteristics even though both linear and non-linear characteristics are present.

In addition, the active device may include a transistor, an IC semiconductor chip, and the like and the passive device may include a condenser, a resistor, an inductor, and the like. The passive device is mounted on a substrate together with an ordinary semiconductor package in order to increase a signal processing speed of a semiconductor chip which is an active device, perform a filtering function, or the like.

As a result, the electronic component 190 may include all of a semiconductor chip, a light-emitting diode chip, and other driving chips.

In addition, a resin molding part 165 is formed on the uppermost insulating layer, and accordingly, the electronic component 190, the wire 195, and the wire-bonded first upper metal layer 130 may be protected by the resin molding part 165.

Meanwhile, the second passivation layer 170 is disposed under the lowermost insulating layer among the plurality of insulating layers. The second passivation layer 170 has an opening exposing a surface of the second upper metal layer 150 on which the adhesive member 175 is to be disposed. The second passivation layer 170 may be formed of a solder resist.

The adhesive member 175 is disposed under the second upper metal layer 150 exposed through the opening of the second passivation layer 170. The adhesive member 175 is a member for soldering.

The adhesive member 175 provides an adhesive force between the printed circuit board 100 and the external substrate. The adhesive member 175 may be formed of a solder ball, or alternatively may be formed by using an adhesive paste or a copper core solder ball.

In addition, the adhesive paste may be formed of a conductive material for electrical conduction, and at this point, when the adhesive paste is formed of the conductive material, the adhesive paste may preferably be formed of a conductive material selected from the group consisting of copper, silver, gold, aluminum, carbon nanotubes, and combinations thereof.

FIG. 2 is a view illustrating the circuit pattern 112 shown in FIG. 1 in detail.

Referring to FIG. 2, the circuit pattern 112 includes a plating seed layer 112a disposed on the insulating layer 111 and a pattern 112b disposed on the plating seed layer 112a.

The plating seed layer 112a is disposed on the insulating layer 111. Preferably, a lower surface of the plating seed layer 112a is in direct contact with an upper surface of the insulating layer 111. The upper and lower surfaces of the plating seed layer 112a may have the same width or different widths.

In addition, a horizontal cross section of the plating seed layer 112a may have any one of various shapes such as a circular shape, a quadrangular shape, a triangular shape, an elliptical shape, a fan shape, and a star shape.

The plating seed layer 112a may be a seed layer for electrolytic plating of the pattern 112b.

The plating seed layer 112a may be formed with a thickness of about 1.5 μm or less.

A circuit pattern part is disposed on the plating seed layer 112a. The circuit pattern part includes a pattern 112b. The pattern 112b may be formed of copper (Cu), or may further include a conductive metal material while including the copper (Cu).

In the circuit pattern part, the pattern 112b may be formed with a thickness of about 8 μm to about 10 μm.

The circuit pattern 112 including the plating seed layer 112a and the pattern 112b may include an upper surface ts, a lower surface bs, a first side surface ls1, and a second side surface ls2.

Specifically, the upper surface ts may be defined as a contact surface of the plating seed layer 112a in contact with the insulating layer 111, and the lower surface bs may be an upper surface of the pattern 112b opposite to the contact surface of the plating seed layer 112a.

In addition, the first side surface ls1 and the second side surface ls2 may be a connection surface connecting the upper surface ts and the lower surface bs. The first side surface ls1 and the second side surface ls2 may include both side surfaces of the plating seed layer 112a and the pattern 112b.

Meanwhile, the upper surface ts is illustrated as a plane in the drawing, but the embodiment is not limited thereto, and the upper surface ts may include a curved surface such as a convex surface or a concave surface.

The upper surface ts, the first side surface ls1, and the second side surface ls2 may have a surface. In addition, the upper surface ts, the first side surface ls1, and the second side surface ls2 may have surface roughness formed at the surface thereof. That is, the circuit pattern 112 may reduce the surface roughness of the upper surface ts, the first side surface ls1, and the second side surface ls2 among entire surfaces thereof.

Specifically, surface roughness Ra of the upper surface ts may be about 0.31 μm or less. Specifically, the surface roughness Ra of the upper surface ts may be about 0.17 μm or less. Specifically, the surface roughness Ra of the upper surface ts may be about 0.05 μm to 0.13 μm. Specifically, the surface roughness Ra of the upper surface ts may be about 0.1 μm to 0.13 μm.

When the surface roughness Ra of the upper surface ts exceeds 0.31 μm, loss of signal and current transmitted via the circuit pattern may be increased by the surface roughness of the surface of the circuit pattern 112. Specifically, the high frequency signal causes a signal and a current to move along the surface of the circuit pattern due to the skin effect, and at this time, the surface roughness at the surface may act as a resistance. Therefore, when the surface roughness Ra exceeds 0.31 μm, the loss of the signal and the current moving along an upper surface of the circuit pattern may be increased by the high surface roughness.

Alternatively, the surface roughness of the upper surface ts may be expressed in other units.

Specifically, surface roughness Rq of the upper surface ts may be about 0.42 μm or less. Specifically, the surface roughness Rq of the upper surface ts may be about 0.21 μm or less. Specifically, the surface roughness Rq of the upper surface ts may be about 0.05 μm to 0.18 μm. Specifically, the surface roughness Rq of the upper surface ts may be about 0.1 μm to 0.18 μm.

In addition, surface roughness Ra of the first side surface ls1 and the second side surface ls2 may be about 0.31 μm or less. Specifically, the surface roughness Ra of the first side surface ls1 and the second side surface ls2 may be about 0.17 μm or less. Specifically, the surface roughness Ra of the first side surface ls1 and the second side surface ls2 may be about 0.05 μm to 0.13 μm. Specifically, the surface roughness Ra of the first side surface ls1 and the second side surface ls2 may be about 0.1 μm to 0.13 μm.

When the surface roughness Ra of the first side surface ls1 and the second side surface ls2 exceeds 0.31 μm, loss of signal and current transmitted via the circuit pattern may be increased by the surface roughness of the surface of the circuit pattern 112. Specifically, the high frequency signal causes a signal and a current to move along the surface of the circuit pattern due to the skin effect, and at this time, the surface roughness at the surface may act as a resistance. Therefore, when the surface roughness Ra exceeds 0.31 μm, the loss of the signal and the current moving along side surfaces of the circuit pattern may be increased by the high surface roughness.

Alternatively, the surface roughness of the first side surface ls1 and the second side surface ls2 may be expressed in other units.

Specifically, surface roughness Rq of the first side surface ls1 and the second side surface ls2 may be about 0.42 μm or less. Specifically, the surface roughness Rq of the first side surface ls1 and the second side surface ls2 may be about 0.21 μm or less. Specifically, the surface roughness Rq of the first side surface ls1 and the second side surface ls2 may be about 0.05 μm to 0.18 μm. Specifically, the surface roughness Rq of the first side surface ls1 and the second side surface ls2 may be about 0.1 vim to 0.18 μm.

Surface roughness values of the upper surface ts, the first side surface ls1, and the second side surface ls2 may be the same. Alternatively, the surface roughness values of the upper surface ts, the first side surface ls1, and the second side surface ls2 may be different from each other.

Specifically, the surface roughness of the upper surface ts, the first side surface ls1, and the second side surface ls2 may vary depending on sizes of the upper surface ts, the first side surface ls1, and the second side surface ls2. Specifically, the surface roughness of the upper surface ts, the first side surface ls1, and the second side surface ls2 may vary depending on lengths of the upper surface ts and the side surface 1s.

Here, the lengths of the upper surface, the lower surface, and the side surface refer to a length in a cross section in a width direction of the circuit pattern, and the lengths of the upper and lower surfaces may correspond to widths of the upper and lower surfaces, respectively, and the length of the side surface may correspond to a height of the side surface.

Here, the lengths of the upper surface ts and the side surface is may be defined as a moving region of a signal and a current moved along the upper surface ts and the side surface 1s.

For example, when the length of the upper surface ts is greater than that of the first side surface ls1 and the second side surface ls2, the surface roughness of the upper surface ts may be smaller than that of the first side surface ls1 and the second side surface ls2.

Alternatively, when the lengths of the first side surface ls1 and the second side surface ls2 are greater than that of the upper surface ts, the surface roughness of the first side surface ls1 and the second side surface ls2 may be smaller than that of the upper surface ts.

That is, since a region in which a current, that is, a signal moves becomes larger in a portion having a large length among the upper surface ts, the first side surface ls1, and the second side surface ls2, in order to minimize the signal loss of the circuit pattern, the surface roughness in a portion having a large length among the upper surface ts, the first side surface is 1, and the second side surface ls2 may be made smaller than that of a portion having a small length.

Figure 3:
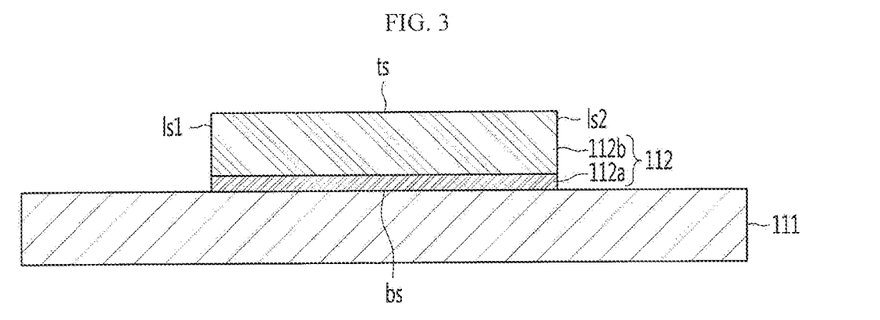

Meanwhile, referring to FIG. 3, the circuit pattern 112 may reduce the surface roughness of the upper surface ts, the lower surface bs, the first side surface ls1, and the second side surface ls2 among entire surfaces of the circuit pattern 112. That is, the surface roughness of the entire surfaces of the circuit pattern 112 may be reduced.

Specifically, surface roughness Ra of the upper surface ts may be about 0.31 μm or less. Specifically, the surface roughness Ra of the upper surface ts may be about 0.17 μm or less. Specifically, the surface roughness Ra of the upper surface ts may be about 0.05 μm to 0.13 μm. Specifically, the surface roughness Ra of the upper surface ts may be about 0.1 μm to 0.13 μm.

When the surface roughness Ra of the upper surface ts exceeds 0.31 μm, loss of signal and current transmitted via the circuit pattern may be increased by the surface roughness of the surface of the circuit pattern 112. Specifically, the high frequency signal causes a signal and a current to move along the surface of the circuit pattern due to the skin effect, and at this time, the surface roughness at the surface may act as a resistance. Therefore, when the surface roughness Ra exceeds 0.31 μm, the loss of the signal and the current moving along an upper surface of the circuit pattern may be increased by the high surface roughness.

Alternatively, the surface roughness of the upper surface ts may be expressed in other units.

Specifically, surface roughness Rq of the upper surface ts may be about 0.42 μm or less. Specifically, the surface roughness Rq of the upper surface ts may be about 0.21 μm or less. Specifically, the surface roughness Rq of the upper surface ts may be about 0.05 μm to 0.18 μm. Specifically, the surface roughness Rq of the upper surface ts may be about 0.1 μm to 0.18 μm.

In addition, surface roughness Ra of the lower surface bs may be about 0.31 μm or less. Specifically, the surface roughness Ra of the lower surface bs may be about 0.17 μm or less. Specifically, the surface roughness Ra of the lower surface bs may be about 0.05 μm to 0.13 μm. Specifically, the surface roughness Ra of the lower surface bs may be about 0.1 μm to 0.13 μm.

When the surface roughness Ra of the lower surface bs exceeds 0.31 μm, loss of signal and current transmitted via the circuit pattern may be increased by the surface roughness of the surface of the circuit pattern 112. Specifically, the high frequency signal causes a signal and a current to move along the surface of the circuit pattern due to the skin effect, and at this time, the surface roughness at the surface may act as a resistance. Therefore, when the surface roughness Ra exceeds 0.31 μm, the loss of the signal and the current moving along a lower surface of the circuit pattern may be increased by the high surface roughness.

Alternatively, the surface roughness of the lower surface bs may be expressed in other units.

Specifically, surface roughness Rq of the lower surface bs may be about 0.42 µm or less. Specifically, the surface roughness Rq of the lower surface bs may be about 0.21 µM or less. Specifically, the surface roughness Rq of the lower surface bs may be about 0.05 µm to 0.18 µm. Specifically, the surface roughness Rq of the lower surface bs may be about 0.1 µm to 0.18 µm.

In addition, surface roughness Ra of the first side surface ls1 and the second side surface ls2 may be about 0.31 µm or less. Specifically, the surface roughness Ra of the first side surface ls1 and the second side surface ls2 may be about 0.17 µm or less. Specifically, the surface roughness Ra of the first side surface ls1 and the second side surface ls2 may be about 0.05 µm to 0.13 µm. Specifically, the surface roughness Ra of the first side surface ls1 and the second side surface ls2 may be about 0.1 µm to 0.13 µm.

When the surface roughness Ra of the first side surface ls1 and the second side surface ls2 exceeds 0.31 µm, loss of signal and current transmitted via the circuit pattern may be increased by the surface roughness of the surface of the circuit pattern 112. Specifically, the high frequency signal causes a signal and a current to move along the surface of the circuit pattern due to the skin effect, and at this time, the surface roughness at the surface may act as a resistance. Therefore, when the surface roughness Ra exceeds 0.31 µm, the loss of the signal and the current moving along side surfaces of the circuit pattern may be increased by the high surface roughness.

Alternatively, the surface roughness of the first side surface ls1 and the second side surface ls2 may be expressed in other units.

Specifically, surface roughness Rq of the first side surface ls1 and the second side surface ls2 may be about 0.42 µm or less. Specifically, the surface roughness Rq of the first side surface ls1 and the second side surface ls2 may be about 0.21 µm or less. Specifically, the surface roughness Rq of the first side surface ls1 and the second side surface ls2 may be about 0.05 µm to 0.18 µm. Specifically, the surface roughness Rq of the first side surface ls1 and the second side surface ls2 may be about 0.1 µm to 0.18 µm.

Surface roughness values of the upper surface ts, the lower surface bs, the first side surface ls1, and the second side surface ls2 may be the same. Alternatively, the surface roughness values of the upper surface ts, the lower surface bs, the first side surface ls1, and the second side surface ls2 may be different from each other.

Specifically, the surface roughness of the upper surface ts, the lower surface bs, the first side surface ls1, and the second side surface ls2 may vary depending on sizes of the upper surface ts, the lower surface bs, the first side surface ls1, and the second side surface ls2. Specifically, the surface roughness of the upper surface ts, the lower surface bs, the first side surface ls1, and the second side surface ls2 may vary depending on lengths of the upper surface ts, the lower surface bs, the first side surface ls1, and the second side surface ls2.

Here, the lengths of the upper surface, the lower surface, and the side surface refer to a length in a cross section in a width direction of the circuit pattern, and the lengths of the upper and lower surfaces may correspond to widths of the upper and lower surfaces, respectively, and the length of the side surfaces may correspond to a height of the side surface.

For example, when the length of the upper surface ts is greater than that of the lower surface bs, the first side surface ls1, and the second side surface ls2, the surface roughness of the upper surface ts may be smaller than that of the lower surface bs, the first side surface ls1, and the second side surface ls2.

Alternatively, when the length of the lower surface bs is greater than that of the upper surface ts, the first side surface ls1, and the second side surface ls2, the surface roughness of the lower surface bs may be smaller than that of the upper surface ts, the first side surface ls1, and the second surface side ls2.

Alternatively, when the lengths of the first side ls1 and the second side ls2 are greater than that of the upper surface ts and the lower surface bs, the surface roughness of the first side surface ls1 and the second side surface ls2 may be smaller than that of the upper surface ts and the lower surface bs.

That is, since a region in which a current, that is, a signal moves becomes larger in a portion having a large length among the upper surface ts, the lower surface bs, the first side surface ls1, and the second side surface ls2, in order to minimize the signal loss of the circuit pattern, the surface roughness in a portion having a large length among the upper surface ts, the lower surface bs, the first side surface ls1, and the second side surface ls2 may be smaller than that of a portion having a small length.

Figure 4A:
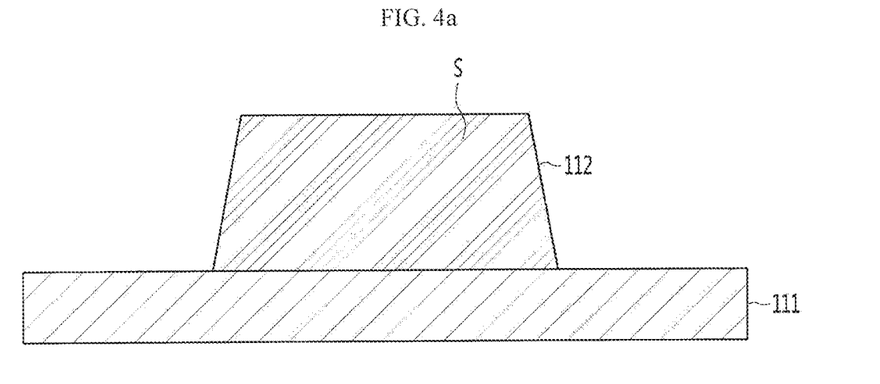
FIGS. 4A, 4B, and 4C are views illustrating signal movement according to an increase in frequency.
Figure 4B:
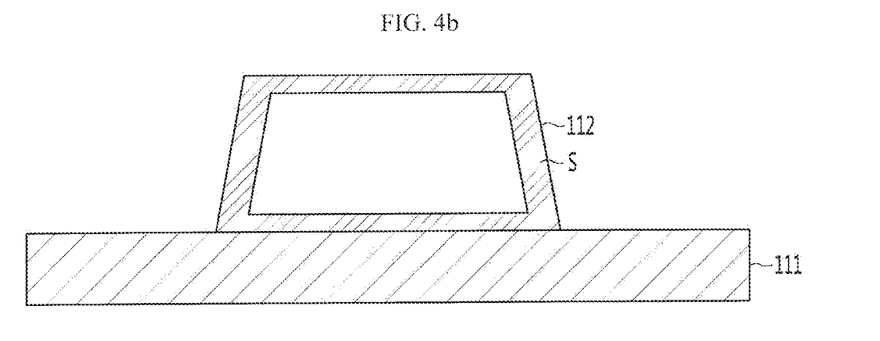
Figure 4C:
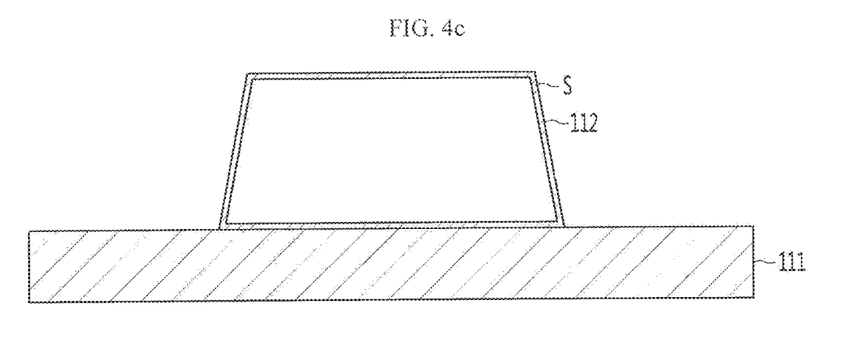

FIGS. 4A, 4B, and 4C are views illustrating a magnitude of signal movement according to a magnitude of a frequency.

Referring to FIGS. 4A, 4B and 4C, it can be seen that the magnitude of the signal movement varies according to changing from a low frequency signal to a high frequency signal.

Specifically, FIG. 4A is a view illustrating signal transmission at a frequency of 1 kHz, FIG. 4B is a view illustrating signal transmission at a frequency of 100 kHz, and FIG. 4C is a view illustrating signal transmission at a frequency of 1 GHz or more, and those are views for comparing a size of a signal transmission region S according to the frequency magnitudes.

Referring to FIGS. 4A, 4B and 4C, it can be seen that an area in which a signal may move becomes smaller according to changing from a low frequency signal to a high frequency signal. This is due to a skin effect that an electrical signal flows to a surface of a conductor as the frequency signal becomes higher.

Equation of the skin effect representing a skin thickness d according to a frequency may be defined as follows.

$$d = 1/\sqrt{(\pi f \mu \sigma)}  \qquad \text{[Equation]}$$

(where d is a skin thickness, f is a frequency, µ is a permeability of a conductor, and G is a conductivity of a conductor)

That is, it can be seen that the skin thickness d is reduced according to the frequency f being changed to a high frequency signal. That is, in the high frequency signal, since a signal is transmitted in a region in which the skin thickness is very thin as shown in the above Equation, the surface roughness of the circuit pattern may have a very important influence on signal transmission. That is, as the surface roughness of the circuit pattern increases, a transmission loss of the signal increases due to surface resistance, and thus electrical efficiency may be lowered.

Therefore, the printed circuit board according to an embodiment may reduce the signal loss due to the skin effect generated in the high frequency signal by minimizing the surface roughness of the circuit pattern in which the signal is moved.

Hereinafter, the present invention will be described in more detail through measurement of a skin thickness according to Exemplary Embodiments and Comparative Examples. Such Exemplary Embodiments are merely illustrative to describe the present invention in more detail. Therefore, the present invention is not limited thereto.

Exemplary Embodiment

After a copper seed layer was fainted on an insulating layer, a copper material was plated on the copper seed layer to form a circuit pattern.

Next, an impedance value of the circuit pattern was measured while changing surface roughness of the circuit pattern during signal transmission at a frequency of 1 GHz.

At this time, the impedance value in each range was measured while changing the surface roughness of the circuit pattern in a range of 0.1 µm to 0.31 µm.

Comparative Example

An impedance value in each range was measured after faulting a circuit pattern in the same manner as in Exemplary Embodiment except that the impedance value was measured while changing the surface roughness of the circuit pattern in a range from more than 0.31 µm to 0.68 µm.

TABLE 1

| | Surface Roughness 1 (Ra) | Surface Roughness 2 (Rq) | Impedance (Ω) |
|---|---|---|---|
| Exemplary Embodiment 1 | 0.31 | 0.42 | 35.3 |
| Exemplary Embodiment 2 | 0.17 | 0.21 | 33.8 |
| Exemplary Embodiment 3 | 0.13 | 0.16 | 33.4 |
| Exemplary Embodiment 4 | 0.10 | 0.12 | 32.6 |
| Comparative Example 1 | 0.68 | 0.86 | 37.4 |
| Comparative Example 2 | 0.82 | 1.07 | 38.5 |

Referring to Table 1, it can be seen that the circuit patterns according to Exemplary Embodiments 1 to 4 have lower surface roughness values than those of the Comparative Examples.

That is, it can be seen that the surface roughness values of the circuit patterns of Exemplary Embodiments 1 to 4 are lower than those of the circuit patterns of the Comparative Examples.

In addition, when comparing the impedance values of the circuit patterns of Exemplary Embodiments 1 to 4 and the circuit patterns of the Comparative Examples, it can be seen that the impedance of the circuit patterns of Exemplary Embodiments 1 to 4 having a small surface roughness value is smaller than that of the circuit patterns of the Comparative Examples.

That is, it can be seen that the circuit patterns of Exemplary Embodiments 1 to 4 may mitigate the surface roughness that interferes with signal transmission on the surface to minimize resistance generated when a signal moves.

Therefore, the circuit patterns of Exemplary Embodiments 1 to 4 control surface roughness values, and accordingly, signal characteristics may be improved by minimizing signal loss due to the resistance.

A printed circuit board according to an embodiment may transmit a high frequency signal via a circuit pattern while minimizing signal loss.

The high frequency signal due to the skin effect may be affected by surface roughness of the circuit pattern. That is, in high frequency signals transmitted along a skin, the surface roughness acts as a resistance as surface roughness increases, and thus loss of the high frequency signal may be caused.

Accordingly, the printed circuit board according to the embodiment controls the surface roughness of at least three or more surfaces of the circuit pattern, and thus signal loss due to the skin effect during transmission of the high frequency signal may be minimized.

In addition, in the circuit pattern of the printed circuit board according to the embodiment, a magnitude of signal movement, that is, the surface roughness in a portion having a large length among surfaces of the circuit pattern is made smaller than that of a portion having a small length, and thus characteristics of the signal transmission may be maximized.

Figure 5:
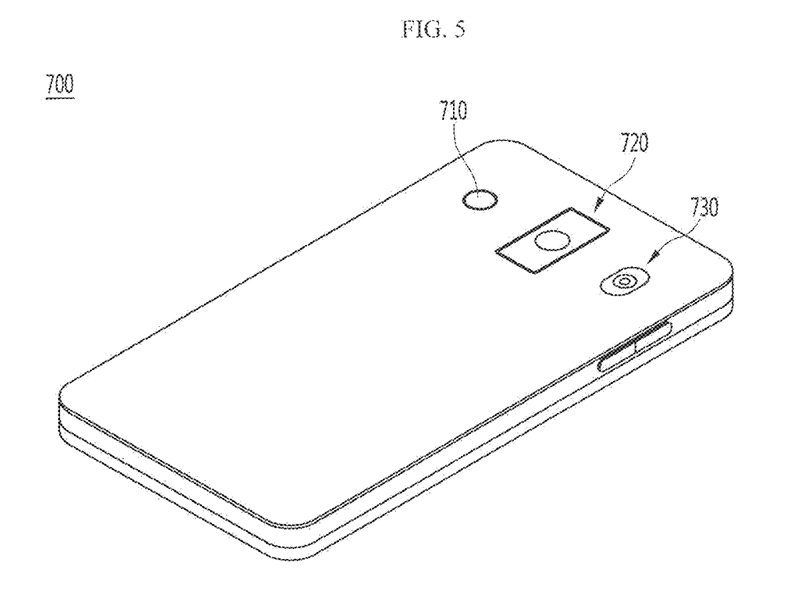
FIG. 5 is a view for describing an example to which a printed circuit board according to an embodiment is applied.

FIG. 5 is a view illustrating a mobile terminal to which a printed circuit board according to an embodiment is applied.

As shown in FIG. 5, a mobile terminal 700 of an embodiment may include a camera module 720, a flash module 730, and an auto focus device 710 provided on a rear surface.

The flash module 730 may include a light-emitting element for emitting light therein. The flash module 730 may be operated by a camera operation of the mobile terminal or user control.

The camera module 720 may include an image photographing function and an auto focus function. For example, the camera module 720 may include an auto focus function using an image.

The auto focus device 710 may include an auto focus function using a laser. The auto focus device 710 may be mainly used in a condition in which the auto focus function using the image of the camera module 720 is deteriorated, for example, in a proximity of 10 m or less or dark environment. The auto focus device 710 may include a light-emitting unit including a vertical cavity surface emitting laser (VCSEL) semiconductor element, and a light receiving unit converting light energy into electrical energy such as a photodiode.

The characteristics, structures, effects, and the like described in the above embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, the above description of the embodiments is merely examples and does not limit the present invention. It would be apparent to those of ordinary skill in the art that the present invention may be easily embodied in many different forms without changing the technical idea or essential features thereof. For example, elements of the exemplary embodiments described herein may be modified and realized. Also, it should be construed that differences related to such changes and applications are included in the scope of the present invention defined in the appended claims.

What is claimed is:

1. A printed circuit board comprising:
  an insulating layer; and
  a circuit pattern disposed on the insulating layer,
  wherein the circuit pattern includes an upper surface, a lower surface, a first side surface, and a second side surface, and wherein a surface roughness Ra of at least three surfaces of the upper surface, the lower surface, the first side surface, and the second side surface of the circuit pattern is 0.17 µm or less.

2. The printed circuit board of claim 1, wherein the surface roughness Ra of at least three surfaces of the upper surface, the lower surface, the first side surface, and the second side surface of the circuit pattern is 0.1 µm to 0.13 µm.

3. The printed circuit board of claim 2, wherein a length of the upper surface is a width of the upper surface,
   wherein a length of the lower surface is a width of the lower surface, and
   wherein a length of the first side surface and a length of the second side surface are a height of the circuit pattern.

4. The printed circuit board of claim 1, wherein at least one of a length of the upper surface and a length of the lower surface in a cross section in a width direction of the circuit pattern is different from at least one of a length of the first side surface and a length of the second side surface in the cross section of the circuit pattern,
   wherein the surface roughness Ra of at least one of the upper and lower surfaces of the circuit pattern is different from the surface roughness Ra of at least one of the first side surface and the second side surface of the circuit pattern.

5. The printed circuit board of claim 4, wherein at least one of the length of the upper surface and the length of the lower surface in the cross section of the circuit pattern is greater than at least one of the length of the first side surface and the length of the second side surface in the cross section of the circuit pattern, and
   wherein the surface roughness Ra of at least one of the upper and lower surfaces of the circuit pattern is smaller than the surface roughness Ra of at least one of the first side surface and the second side surface of the circuit pattern.

6. The printed circuit board of claim 1, wherein the surface roughness Ra of at least three surfaces of the upper surface, the lower surface, the first side surface, and the second side surface of the circuit pattern is 0.42 µm or less.

7. The printed circuit board of claim 1, wherein the circuit pattern comprises:
   a plating seed layer disposed on the insulating layer; and
   a pattern layer disposed on the plating seed layer.

8. The printed circuit board of claim 7, wherein the upper surface of the circuit pattern is an upper surface of the pattern layer,
   wherein the lower surface of the circuit pattern is a lower surface of the plating seed layer,
   wherein the first side surface of the circuit pattern includes a first side surface of the plating seed layer and a first side surface of the pattern layer, and
   wherein the second side surface of the circuit pattern includes a second side surface of the plating seed layer and a second side surface of the pattern layer.

9. The printed circuit board of claim 1, wherein a length of the upper surface in a cross-section in a width direction of the circuit pattern is smaller than a length of the lower surface in the cross-section in the width direction of the circuit pattern.

10. The printed circuit board of claim 9, wherein at least one of the first side surface and the second side surface in the cross-section in the width direction of the circuit pattern has a predetermined inclination angle and connects between the upper surface and the lower surface of the circuit pattern.

11. A printed circuit board comprising:
    an insulating layer; and
    a circuit pattern disposed on the insulating layer,
    wherein the circuit pattern includes an upper surface, a lower surface, a first side surface, and a second side surface,
    wherein a surface roughness Ra of at least three surfaces of the upper surface, the lower surface, the first side surface, and the second side surface of the circuit pattern is 0.31 µm or less, and
    wherein an impedance of the circuit pattern is 35.3Ω or less.

* * * * *